United States Patent
Benoit et al.

(10) Patent No.: US 10,304,893 B2
(45) Date of Patent: May 28, 2019

(54) BACK-SIDE ILLUMINATED IMAGE SENSOR (71) Applicant: STMicroelectronics (Crolles 2) SAS, Crolles (FR)

(72) Inventors: Daniel Benoit, Saint-Ismier (FR); Olivier Hinsinger, Barraux (FR); Emmanuel Gourvest, Voiron (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 69 days.

(21) Appl. No.: 15/592,437

(22) Filed: May 11, 2017

(65) Prior Publication Data

US 2018/0102385 A1 Apr. 12, 2018

(30) Foreign Application Priority Data

Oct. 7, 2016 (FR) ..................... 16 59700

(51) Int. Cl.
*H01L 27/146* (2006.01)

(52) U.S. Cl.
CPC ...... *H01L 27/1464* (2013.01); *H01L 27/1462* (2013.01); *H01L 27/1463* (2013.01); *H01L 27/14609* (2013.01); *H01L 27/14623* (2013.01); *H01L 27/14629* (2013.01); *H01L 27/14636* (2013.01); *H01L 27/14685* (2013.01); *H01L 27/14687* (2013.01); *H01L 27/14698* (2013.01)

(58) Field of Classification Search
CPC .......... H01L 27/1464; H01L 27/14636; H01L 27/14698; H01L 27/14685; H01L 27/1462
See application file for complete search history.

(56) References Cited

U.S. PATENT DOCUMENTS

| | | |
|---|---|---|
| 2013/0070131 A1 | 3/2013 | Ohkubo et al. |
| 2014/0131779 A1 | 5/2014 | Takeda |
| 2014/0374868 A1 | 12/2014 | Lee et al. |
| 2015/0243694 A1 | 8/2015 | Ihara |
| 2016/0118438 A1 | 4/2016 | Leung et al. |
| 2016/0225815 A1 | 8/2016 | Um et al. |

FOREIGN PATENT DOCUMENTS

EP 3016141 A1 5/2016

OTHER PUBLICATIONS

INPI Search Report and Written Opinion for FR 1659700 dated May 24, 2017 (10 pages).

*Primary Examiner* — Hrayr A Sayadian
(74) *Attorney, Agent, or Firm* — Crowe & Dunlevy (57) ABSTRACT

A back-side illuminated image sensor includes memory regions formed in a semiconductor wafer. Each memory region is located between two opaque walls which extend into the semiconductor wafer. An opaque screen is arranged at the rear surface of the memory region and in electrical contact with the opaque walls.

14 Claims, 7 Drawing Sheets

BACK-SIDE ILLUMINATED IMAGE SENSOR

PRIORITY CLAIM

This application claims the priority benefit of French Application for Patent No. 1659700, filed on Oct. 7, 2016, the disclosure of which is hereby incorporated by reference in its entirety.

TECHNICAL FIELD

The present disclosure relates to a semiconductor device, and more particularly to a back-side illuminated image sensor.

BACKGROUND

An image sensor comprises an array of pixels formed from a semiconductor wafer. Charges are generated in each pixel according to the light received during an acquisition period, and the number of generated charges is read during a read period. In certain image sensors, the pixels are associated with memory regions where the generated charges are periodically transferred to be read later on.

A problem is that light may reach the memory areas between the transfer and read time, and generate electron/hole pairs therein. This modifies the number of stored charges, which decreases the image quality. This problem is in particular raised for back-side illuminated image sensors. Structures of optical isolation of the memory regions have been provided, such as that described in United States Patent Application Publication No. 2016/0118438, which provides, in relation with its FIG. 2, for surrounding each memory region with opaque tungsten walls and providing on the back side a tungsten shield layer. However, the opaque walls and the shield layer are not contiguous and light may pass therebetween and reach the memory region. Such structures thus let through part of the light. These structures further have various manufacturing and implementation problems.

It is thus desired to have a back-side illuminated image sensor comprising memory regions efficiently protected from light, as well as a method of manufacturing such a sensor.

SUMMARY

An embodiment provides a back-side illuminated image sensor, comprising memory regions formed in a semiconductor wafer, each memory region being located between two opaque walls which extend into the wafer and are in contact with an opaque screen arranged on the rear surface of the memory region.

According to an embodiment, for each memory region, the opaque walls and the opaque screen are conductive and are connected to a node of application of a bias potential.

According to an embodiment, the opaque walls and the opaque screens are made of tungsten and the opaque walls have a thickness in the range from 50 to 200 nm.

According to an embodiment, the opaque walls are separated from the memory regions by a hafnium oxide layer.

According to an embodiment, each opaque wall is separated from the associated memory region by a polysilicon layer, the polysilicon layer being separated from the associated memory region by a silicon oxide layer.

According to an embodiment, the opaque walls are separated from the polysilicon layers by a hafnium oxide layer.

An embodiment provides a method of manufacturing a back-side illuminated image sensor, comprising the successive steps of: a) forming trenches arranged on either side of memory regions in the front surface of a semiconductor wafer; b) filling the trenches with silicon nitride; c) forming transistors inside and on top of the front surface; d) etching by chemical-mechanical polishing the rear surface all the way to the silicon nitride; e) removing the silicon nitride by selective etching from the rear surface; f) forming opaque walls by filling the trenches with an opaque material; and g) forming on the rear surface of each memory region an opaque screen in contact with the opaque walls.

According to an embodiment, the opaque walls and the opaque screens are made of tungsten, the opaque walls having a thickness in the range from 50 nm to 200 nm.

According to an embodiment, the method comprises, between steps e) and f): covering the structure with a hafnium oxide layer.

According to an embodiment, the method comprises, between steps d) and e): covering the structure with a hafnium oxide layer; and etching openings extending from the rear surface to the silicon nitride.

According to an embodiment, the method comprises: between steps a) and b), forming an electrically-insulating layer and then a polysilicon layer on the lateral walls and on the bottom of the trenches; at step b), incompletely filling the silicon nitride trenches; and between steps b) and c), completing the trench filling with polysilicon.

According to an embodiment, at step b), the silicon nitride is recessed by from 50 nm to 150 nm from the front surface of the wafer, the trenches having a depth in the range from 3 μm to 12 μm.

According to an embodiment, the method further comprises, at step b): covering the front surface with a silicon nitride layer filling the trenches; and removing by selective wet etching the portions of the silicon nitride layer which cover the front surface.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

The same elements have been designated with the same reference numerals in the various drawings and, further, the various drawings are not to scale. For clarity, only those steps and elements which are useful to the understanding of the described embodiments have been shown and are detailed. In particular, conductive interconnection lines and elements such as transistors and photodiodes are not shown.

In the following description, when reference is made to terms qualifying the absolute position, such as terms "left", "right", etc. or the relative position, such as terms "upper", "lower", etc., reference is made to the orientation of the concerned element in the corresponding drawings. Unless otherwise specified, expression "in the order of" means to within 10%, preferably to within 5%.

FIGS. 1 to 9 are simplified cross-section views illustrating an embodiment of a back-side illuminated image sensor at successive steps of its manufacturing. The sensor comprises a pixel array, and the manufacturing of a single one of these pixels and of portions of neighboring pixels has been shown.

Figure 1:
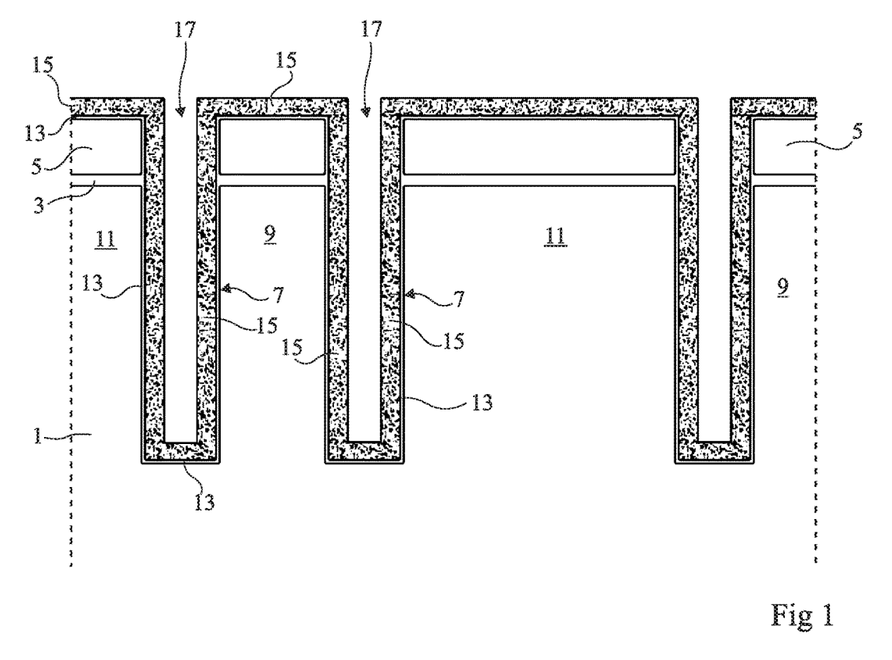
FIGS. 1 to 9 are partial simplified cross-section views illustrating steps of an embodiment of a method of manufacturing a back-side illuminated image sensor, FIG. 9 illustrating the obtained sensor.

At the step of FIG. 1, the front surface has been covered with a semiconductor wafer 1, for example, made of silicon, with an etch stop layer 3, for example, made of silicon oxide, and then with a silicon nitride masking layer 5. Trenches 7 have been etched in semiconductor wafer 1. Trenches 7 are arranged in pairs on either side of regions 9 of wafer 1 which correspond to future memory regions. A pair of trenches 7 and the associated region 9 are visible in the left-hand portion of FIG. 1. Memory region 9 preferably has an elongated shape in the direction orthogonal to the plane of the drawings. Each pixel comprises a photodiode which will be formed in a region 11 located outside of the pairs of trenches 7.

An electrically-insulating layer 13 of small thickness, for example, made of silicon oxide, has then been conformally deposited. Layer 13 covers the lateral walls and the bottom of trenches 7.

A polysilicon layer 15 is then conformally deposited on the front surface. Layer 15 covers, in particular, the portions of layer 13 located in the trenches. Layers 13 and 15 have a total thickness smaller than half that of trenches 7, so that there remain recesses 17 at the heart of trenches 7. As a variation, layer 15 may be omitted.

As an example, trenches 7 have a width in the order of 200 nm. Trenches 7 may extend into the wafer down to a depth in the range from 3 to 10 µm, for example, 6 µm. Insulating layer 13 may have a thickness in the range from 5 to 20 nm, for example, 12 nm. Recesses 17 may have a width in the range from 50 to 200 nm, for example, 70 nm.

Figure 2:
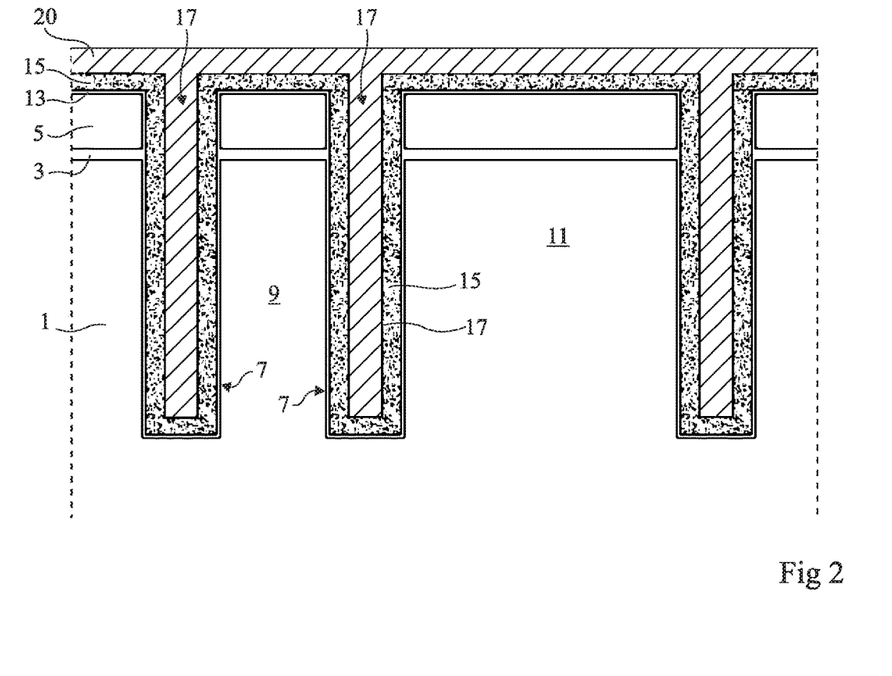

At the step of FIG. 2, a silicon nitride layer 20 is deposited on the front surface to fill recesses 17.

Figure 3:
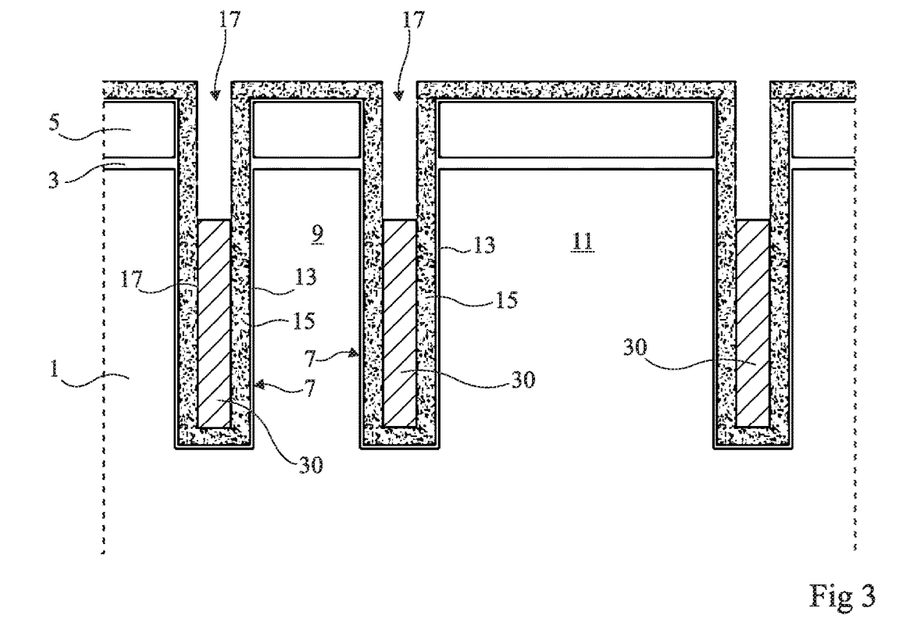

At the step of FIG. 3, silicon nitride layer 20 is removed, for example, by a wet etching, with an etching time provided so that there remain silicon nitride sacrificial walls 30 in recesses 17. As an example, sacrificial walls 30 fill recesses 17 up to a level located at a depth in the range from 50 to 150 nm under the front surface of wafer 1.

Figure 4:
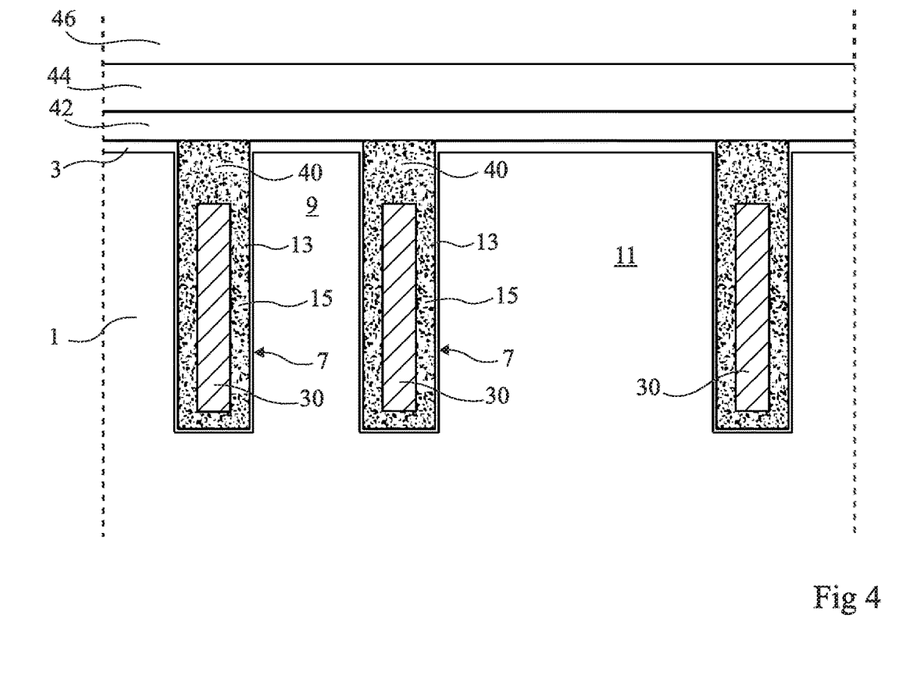

At the step of FIG. 4, the portions 40 of recesses 17 which have remained empty have been filled with polysilicon. All the elements located on the front surface above the level of etch stop layer 3 have been removed by chemical-mechanical polishing.

Doping steps are then carried out, in particular for the forming of memory regions 9 and of photodiode regions 11, as well as for the forming of various transistors such as transfer, read, or reset transistors. These steps may be implemented due to the fact that the deep trenches, which imply a high thermal budget for their manufacturing, have already been formed and filled. During these steps, sacrificial walls 30 may be submitted to high temperatures during anneal steps. Sacrificial walls 30 advantageously resist these steps due to their being made of silicon nitride. Further, layers 13 and 15 which cover the sides of sacrificial walls 30 enable to avoid any risk for nitrogen atoms originating from the sacrificial walls to reach memory regions 9 or photodiode regions 11.

A protection layer 42, for example, made of silicon nitride, and an insulation layer 44, for example, made of silicon oxide, are then deposited. Layers 46 comprising interconnection lines are formed on layer 44.

Figure 5:
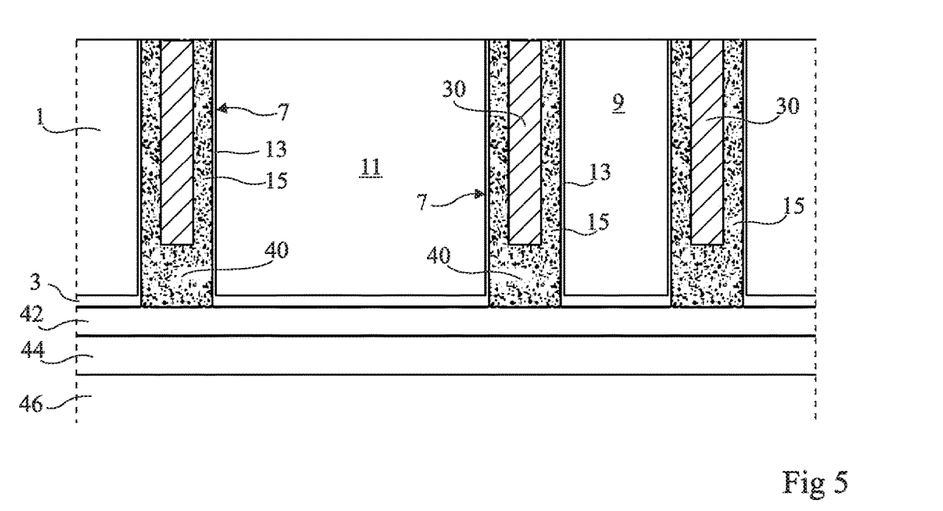

At the step of FIG. 5, the wafer has been flipped. The rear surface or back side is now located in the upper portion of FIGS. 5 to 9. Memory region 9 and the associated trenches 7 are located in the right-hand portion. The elements located above the level of sacrificial walls 30 are then removed, for example, by chemical-mechanical polishing of the rear surface, so that the sacrificial walls are flush with the polished rear surface.

Figure 6:
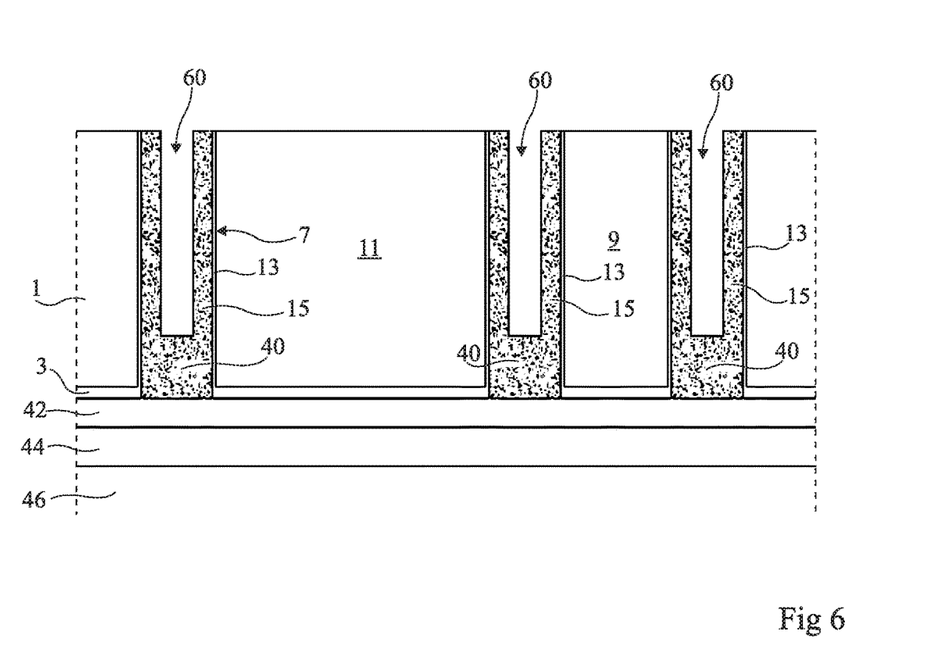

At the step of FIG. 6, sacrificial walls 30 are removed. Due to the fact that sacrificial walls 30 are made of silicon nitride, sacrificial walls 30 may advantageously be easily removed by selective wet etching in the example where the only other materials present on the back side are silicon and silicon oxide. Such a selective wet etching may be performed by a phosphoric acid solution $H_3PO_4$. Recesses 60 are obtained at the locations of sacrificial walls 30.

Figure 7:
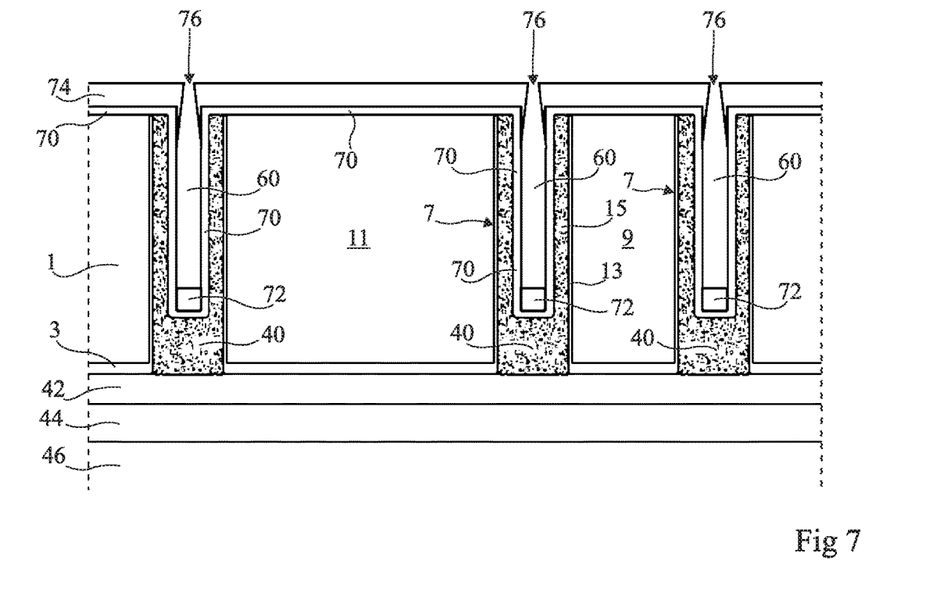

At the step of FIG. 7, a layer 70 made of a positively-charged passivation material, such as hafnium oxide $HfO_2$, is deposited. Layer 70 covers the rear surfaces of memory regions 9 and of photodiode 11, and covers the walls and the bottom of recesses 60. Silicon oxide is then deposited on layer 70. The deposition is non-conformal, that is, it mainly covers the surfaces oriented towards the back side. One thus forms, in addition to portions 72 on the bottoms of recesses 60, a silicon oxide layer 74 which exhibits an opening 76 at the level of each recess.

As an example, layer 70 has a thickness in the range from 4 to 10 nm. Layer 74 may have a thickness in the range from 30 to 40 nm. As a variation, layer 70 may be omitted.

Figure 8:
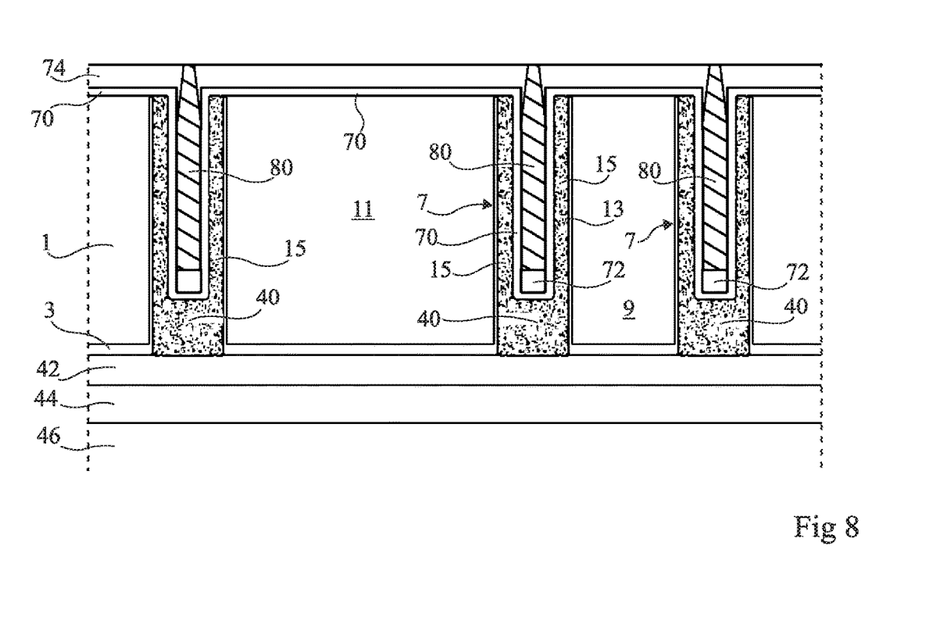

At the step of FIG. 8, recesses 60 are filled with an opaque material, that is, a material having an optical extinction coefficient greater than 1, for example, tungsten. The filling is performed via openings 76, for example, by a tungsten deposition on the rear surface, followed by a chemical-mechanical polishing down all the way to layer 74. Layer 74 is then used as a polishing stop layer. Opaque walls 80 flush with the surface of layer 74 are obtained. Opaque walls 80 have their sides covered with layer 70.

According to an advantage of the method described herein, due to the fact that the tungsten deposition is performed after the step of forming the transistors discussed in relation with FIG. 4, and particularly after the anneal steps, various problems are avoided, such as problems of tungsten diffusion into memory and photodiode regions 9 and 11.

Figure 9:
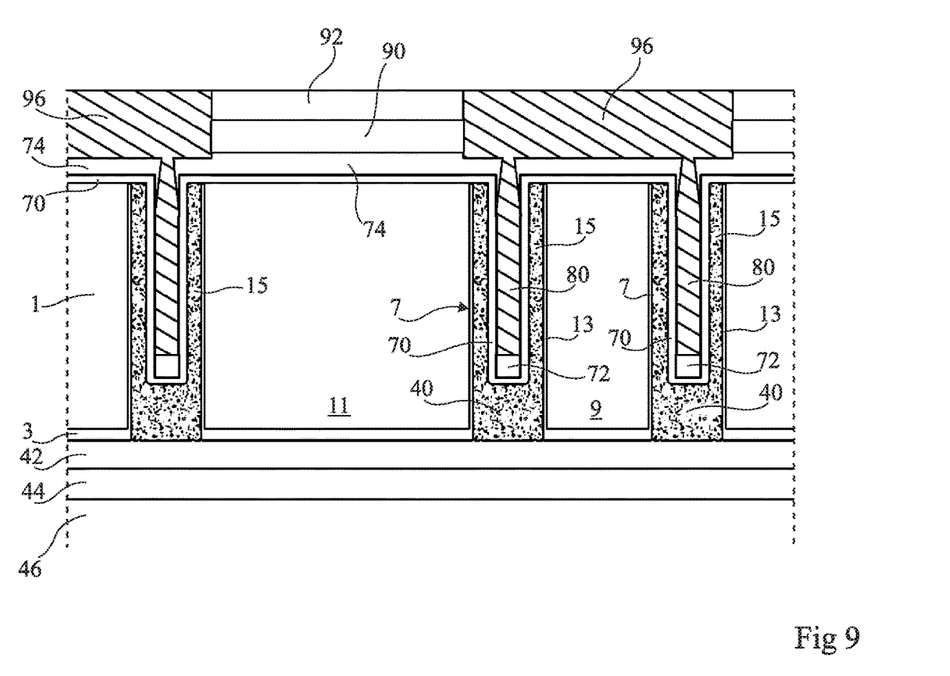

At the step of FIG. 9, antireflection layers 90 and 92 are deposited on layer 74. As an example, layer 90 is made of tantalum oxide and layer 92 is made of silicon oxide. The thickness of layer 90 is selected so that this layer, sandwiched between layers 74 and 92, forms an antireflection coating. The portions of layers 92 and 90 located opposite memory regions 9 and opaque walls 80 are etched from the back side, and the etching is continued down to a level located in layer 74. Due to the provision of layer 74, a portion of the opaque walls is exposed at the bottom of the etched portions. The etched portions, for example, tungsten, are filled with an opaque material. Due to the fact that the opaque walls are partly exposed, the tungsten is in contact with opaque walls 80. Opaque screens 96 have thus been obtained on the back side of memory regions 9, in contact with opaque walls 80.

Each memory region 9 is thus located between two opaque walls 80 in contact with opaque screen 96. In operation, when the back side of the image sensor is illuminated by an optical radiation, memory region 9 is particularly efficiently protected from the radiation, particularly due to the contact between opaque screen 96 and opaque walls 80. The obtained image sensor thus has a particularly high image quality.

As an example, each opaque screen 96 is connected to a node of application of a bias potential (not shown). Due to the fact for opaque walls 80 and the associated opaque screen 96 to be surrounded with the insulating materials of layers 70, 74, 90, and 92, the assembly of the opaque walls and of the screen can then be biased, which enables to control the operation of the memory cell.

FIGS. 10 to 13 are simplified cross-section views illustrating another embodiment of a back-side illuminated image sensor at successive steps of its manufacturing. The manufacturing of a single pixel and of portions of neighboring pixels have been shown in the same way as in FIGS. 1 to 9.

Figure 10:
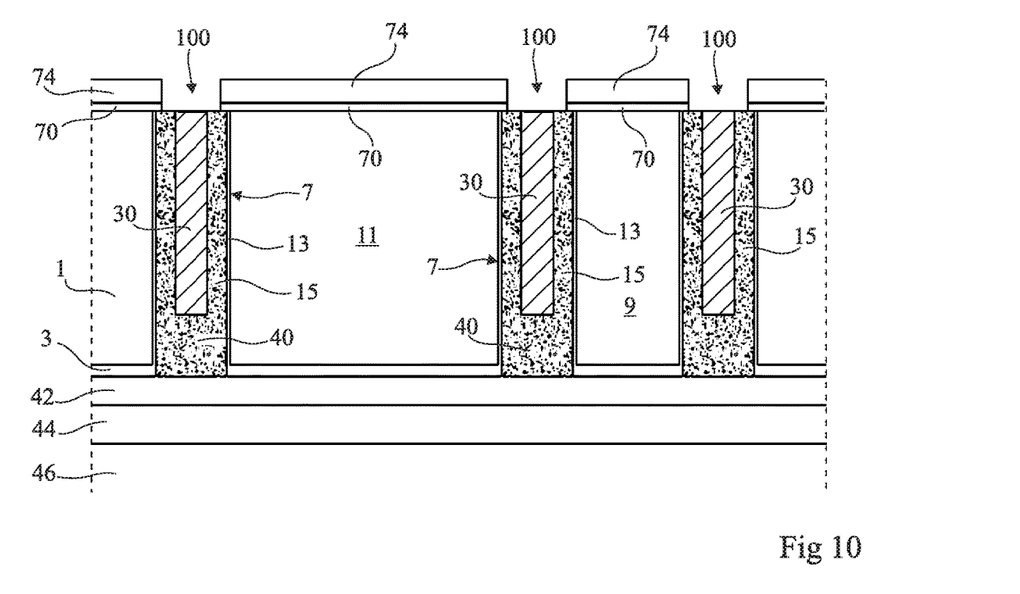
FIGS. 10 to 13 are partial simplified cross-section views illustrating steps of another embodiment of a method of manufacturing a back-side illuminated image sensor, FIG. 13 illustrating the obtained sensor.

At the step of FIG. 10, from a semiconductor wafer 1, steps similar to those of FIGS. 1 to 5 have been successively implemented. The back side is thus located in the upper portion of FIGS. 10 to 13.

The rear surface or back side is covered with a passivation layer 70, for example, made of hafnium oxide $HfO_2$, and then with a silicon oxide layer 74. An opening 100 is then etched from the back side above each of sacrificial walls 30, opening 100 extending through layer 70 and 74 all the way to sacrificial wall 30.

Figure 11:
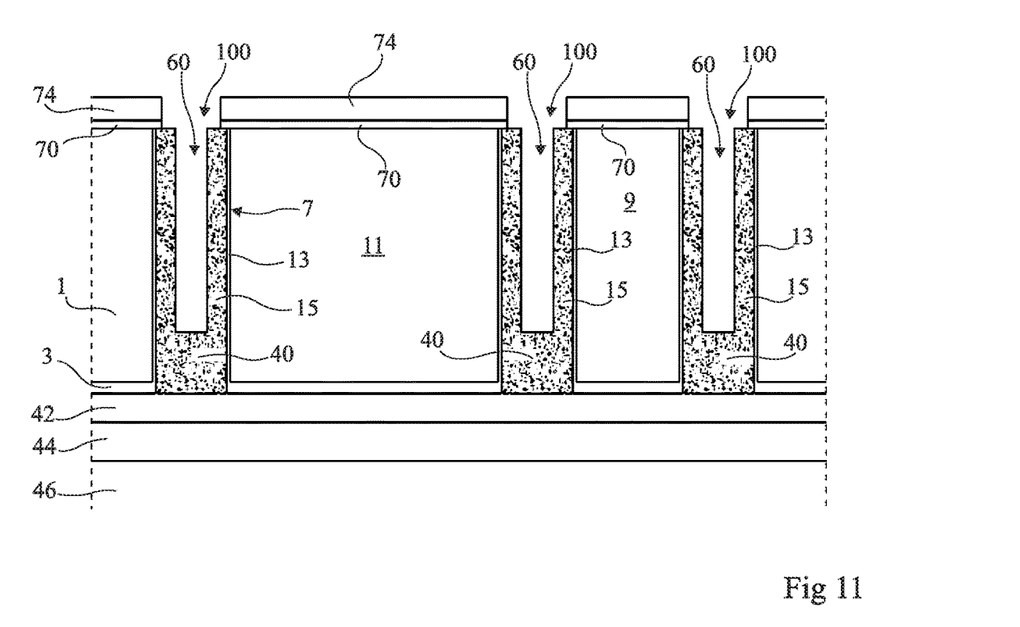

At the step of FIG. 11, sacrificial walls 30 are removed in a way similar to that previously described in relation with FIG. 6, that is, by selective wet etching. A recess 60 is obtained at the location of each sacrificial wall 30, each recess 60 emerging towards the back side through the associated opening 100.

Figure 12:
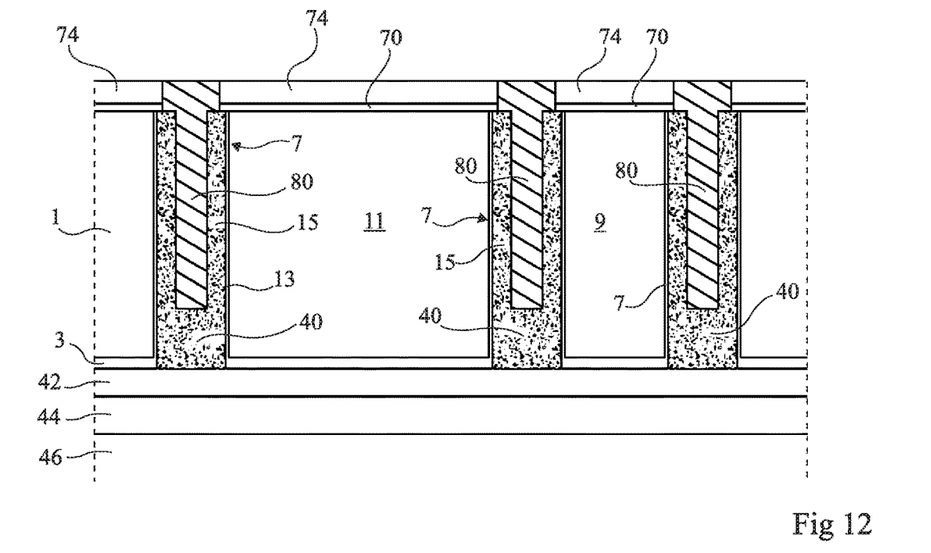

The step of FIG. 12 is carried out in a way similar to that previously described in relation with FIG. 8, that is, by filling with an opaque material recesses 60 and openings 100, and then by polishing the rear surface all the way to polishing stop layer 74.

Figure 13:
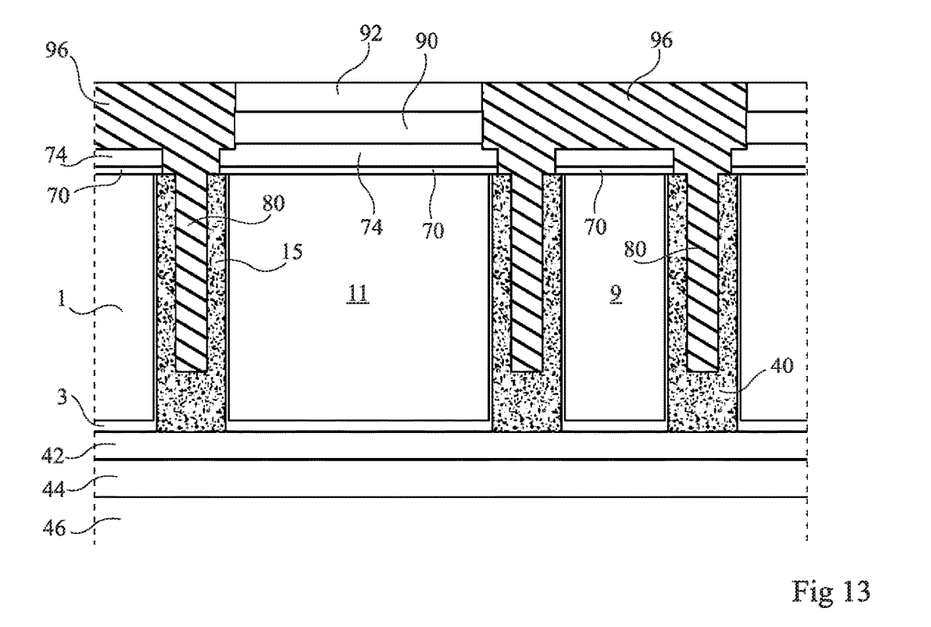

The step of FIG. 13 is carried out similarly to that described in relation with FIG. 9. One obtains, on the one hand, an antireflection coating 74, 90, and 92 covering passivation layer 70 on the rear surface of each of photodiode regions 11 and, on the other hand, an opaque screen 96 located on the rear surface of each memory region 9. Each opaque screen 96 is in contact with opaque walls 80 delimiting each memory region 9.

Specific embodiments have been described. Various alterations, modifications, and improvements will occur to those skilled in the art. In particular, at the step of FIG. 4, one via may be formed for each trench between, on the one hand, portion 40 and polysilicon layer 15 and, on the other hand, a node of application of a bias potential. The memory cell operation can thus be controlled.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of forming a back-side illuminated image sensor, comprising the successive steps of:
   a) forming trenches extending into a semiconductor wafer from a front surface of the semiconductor wafer, said trenches arranged on either side of a memory region;
   b) filling the trenches with silicon nitride;
   c) forming transistors at the front surface;
   d) chemical-mechanical polishing a rear surface of the semiconductor wafer to reach the silicon nitride;
   e) removing the silicon nitride by selective etching from the rear surface to form openings;
   f) forming opaque walls by filling the openings with an opaque material; and
   g) forming on the rear surface an opaque screen in contact with the opaque walls and covering the memory region.

2. The method of claim 1, wherein the opaque walls and the opaque screens are made of tungsten.

3. The method of claim 1, further comprising, between steps e) and f): depositing a layer of hafnium oxide in said openings left by removal of the silicon nitride.

4. The method of claim 1, further comprising, between steps d) and e):
   depositing a layer of hafnium oxide on the rear surface; and
   etching openings extending from the rear surface to reach the silicon nitride.

5. The method of claim 1, comprising:
   between steps a) and b), forming an electrically-insulating layer and then a polysilicon layer on the lateral walls and on the bottom of the trenches;
   at step b), incompletely filling the trenches with silicon nitride; and
   between steps b) and c), filling a remaining portion of the trenches with polysilicon.

6. The method of claim 5, further comprising, at step b), recessing the silicon nitride from the front surface of the semiconductor wafer.

7. The method of claim 1, further comprising, at step b):
   depositing a silicon nitride layer within the trenches and covering the front surface of the semiconductor wafer; and
   removing by selective wet etching the portions of the silicon nitride layer which cover the front surface.

8. A method of forming a back-side illuminated image sensor, comprising:
   forming a pair of trenches extending into a semiconductor wafer from a front surface of the semiconductor wafer, said pair of trenches delimiting a memory region;
   depositing a layer of polysilicon on side walls of each trench and at a bottom of each trench to leave a first opening;
   partially filling said first opening in each trench with silicon nitride;
   filling a remaining portion of said first opening in each trench with polysilicon;
   etching by chemical-mechanical polishing a rear surface of the semiconductor wafer to reach the silicon nitride;
   removing the silicon nitride by selective etching from the rear surface to leave a second opening in each trench;
   depositing an opaque material in each second opening to form an opaque wall in each trench; and
   forming on the rear surface an opaque screen in contact with the opaque walls and covering the memory region.

9. The method of claim 8, further comprising lining the second opening with a layer of hafnium oxide before depositing the opaque material in each second opening.

10. The method of claim 8, wherein the opaque walls and the opaque screen are made of an electrically conductive material.

11. The method of claim 10, wherein the conductive material is tungsten.

12. The method of claim 2, wherein the opaque walls have a thickness in the range from 50 nm to 200 nm.

13. The method of claim 6, wherein recessing has a depth of from 50 nm to 150 nm.

14. The method of claim 6, wherein the trenches have a depth in the range from 3 μm to 12 μm.

* * * * *